US010664333B2

(12) United States Patent
Cha

(10) Patent No.: US 10,664,333 B2
(45) Date of Patent: May 26, 2020

(54) SEMICONDUCTOR MEMORY DEVICE INCLUDING A CONTROLLER FOR CONTROLLING POWER AND ELECTRONIC DEVICE INCLUDING THE SEMICONDUCTOR MEMORY DEVICE

(71) Applicant: SAMSUNG ELECTRONICS CO., LTD., Suwon-si, Gyeonggi-do (KR)

(72) Inventor: Gyu-Hwan Cha, Suwon-si (KR)

(73) Assignee: SAMSUNG ELECTRONICS, CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/139,721

(22) Filed: Sep. 24, 2018

(65) Prior Publication Data

US 2019/0237124 A1    Aug. 1, 2019

(30) Foreign Application Priority Data

Feb. 1, 2018 (KR) .......................... 10-2018-0012999

(51) Int. Cl.
| G06F 11/00 | (2006.01) |
| G11C 5/14 | (2006.01) |
| G11C 11/4074 | (2006.01) |
| G11C 11/4072 | (2006.01) |

(52) U.S. Cl.
CPC ............... *G06F 11/00* (2013.01); *G11C 5/14* (2013.01); *G11C 5/147* (2013.01); *G11C 11/4072* (2013.01); *G11C 11/4074* (2013.01); *G11C 2207/2227* (2013.01)

(58) Field of Classification Search
CPC ........................... G11C 11/4074; G11C 5/147
See application file for complete search history.

(56) References Cited

U.S. PATENT DOCUMENTS

| 5,615,162 | A | * | 3/1997 | Houston | .................. | G11C 5/14 |
| | | | | | | 365/226 |
| 7,099,234 | B2 | | 8/2006 | Parris et al. | | |
| 7,555,659 | B2 | | 6/2009 | Lines | | |
| 7,580,312 | B2 | | 8/2009 | Rajan et al. | | |
| 8,713,256 | B2 | | 4/2014 | Sodhi et al. | | |
| 8,892,942 | B2 | | 11/2014 | Warnes et al. | | |
| 9,733,684 | B2 | | 8/2017 | Choi et al. | | |

(Continued)

FOREIGN PATENT DOCUMENTS

KR        10-0263376        8/2000

*Primary Examiner* — Ajay Ojha
(74) *Attorney, Agent, or Firm* — F. Chau & Associates, LLC

(57) ABSTRACT

A semiconductor memory device includes a memory including a plurality of units, and a controller. Under control of the controller, a power for an operation of the memory is independently supplied to each of the plurality of units or is independently blocked with respect to each of the plurality of units. Each of the plurality of units may be one of a package, die, or chip. A supply of the power to at least a part of the plurality of units, to which the power is supplied, may be blocked under control of the controller. Accordingly, unnecessary power consumption may be prevented. Furthermore, power may be additionally supplied to at least a part of the plurality of units to which the power is not supplied, under control of the controller, and these units may be initialized.

17 Claims, 12 Drawing Sheets

(56) References Cited

U.S. PATENT DOCUMENTS

| | | | |
|---|---|---|---|
| 2003/0145239 A1* | 7/2003 | Kever | G06F 1/3203 |
| | | | 713/300 |
| 2006/0294414 A1* | 12/2006 | Mundada | G06F 11/073 |
| | | | 714/5.11 |
| 2010/0077240 A1 | 3/2010 | Daga et al. | |
| 2011/0141838 A1* | 6/2011 | Kishibe | G11C 11/417 |
| | | | 365/226 |
| 2015/0168972 A1* | 6/2015 | Mathiyalagan | G05F 1/625 |
| | | | 365/226 |
| 2016/0358642 A1 | 12/2016 | Yang | |
| 2017/0132144 A1 | 5/2017 | Solihin | |

* cited by examiner

SEMICONDUCTOR MEMORY DEVICE INCLUDING A CONTROLLER FOR CONTROLLING POWER AND ELECTRONIC DEVICE INCLUDING THE SEMICONDUCTOR MEMORY DEVICE

CROSS-REFERENCE TO RELATED APPLICATION

This application claims priority under 35 U.S.C. § 119 to Korean Patent Application No. 10-2018-0012999, filed on Feb. 1, 2018 in the Korean Intellectual Property Office, the disclosure of which is incorporated by reference herein in its entirety.

TECHNICAL FIELD

Exemplary embodiments of the inventive concept described herein relate to an electronic device, and more particularly, relate to an electronic device for efficiently controlling the power supply to a semiconductor memory device.

DISCUSSION OF RELATED ART

Nowadays, the use of mobile devices such as smartphones, tablet personal computers (PCs), digital cameras, and wearable devices is significantly increasing. According to the mobile trend, semiconductor memory devices having high integration, high performance, and low power are being developed to be used in mobile devices.

A semiconductor memory device that is configurable with a volatile memory, such as a dynamic random access memory (DRAM), may be assembled in one package after being implemented, by using one die (or chip). As applications of the mobile device require high-performance and high-capacity memories, a capacity of each die in the semiconductor memory device may gradually increase. Additionally, the number of dies constituting the semiconductor memory device is increasing.

Since power consumption of the semiconductor memory device is generally proportional to the capacity of the semiconductor memory device, the power consumption may also increase.

SUMMARY

According to an exemplary embodiment of the inventive concept, a semiconductor memory device may include a memory including a plurality of units, and a controller. Under control of the controller, a power for an operation of the memory may be independently supplied to each of the plurality of units or may be independently blocked with respect to each of the plurality of units.

According to an exemplary embodiment of the inventive concept, a semiconductor memory device may include a memory including a plurality of packages, and a controller configured to control the memory. Under control of the controller, a power for an operation of the memory is independently supplied to each of the plurality of packages or is independently blocked with respect to each of the plurality of packages.

According to an exemplary embodiment of the inventive concept, an electronic device may include a host and a semiconductor memory device. The semiconductor memory device may include a memory including a plurality of units, and a controller. Under control of the controller, a power for an operation of the memory may be independently supplied to each of the plurality of units or may be independently blocked with respect to each of the plurality of units.

According to an exemplary embodiment of the inventive concept, an electronic device includes a semiconductor memory device and a power management integrated circuit (PMIC) including a plurality of transistors connected to the semiconductor device via a plurality of power lines and configured to provide power to the semiconductor device through the plurality of power lines. The semiconductor memory device includes a memory including a package including a plurality of dies, where the plurality of dies are respectively connected to the plurality of transistors via the plurality of power lines, and a controller. The controller generates a control signal to independently control the plurality of transistors of the PMIC. Each of the plurality of transistors passes or blocks a current flowing to a corresponding one of the plurality of dies.

BRIEF DESCRIPTION OF THE FIGURES

The above and other objects and features of the inventive concept will become apparent by describing in detail exemplary embodiments thereof with reference to the accompanying drawings.

DETAILED DESCRIPTION OF THE EMBODIMENTS

Figure 1:
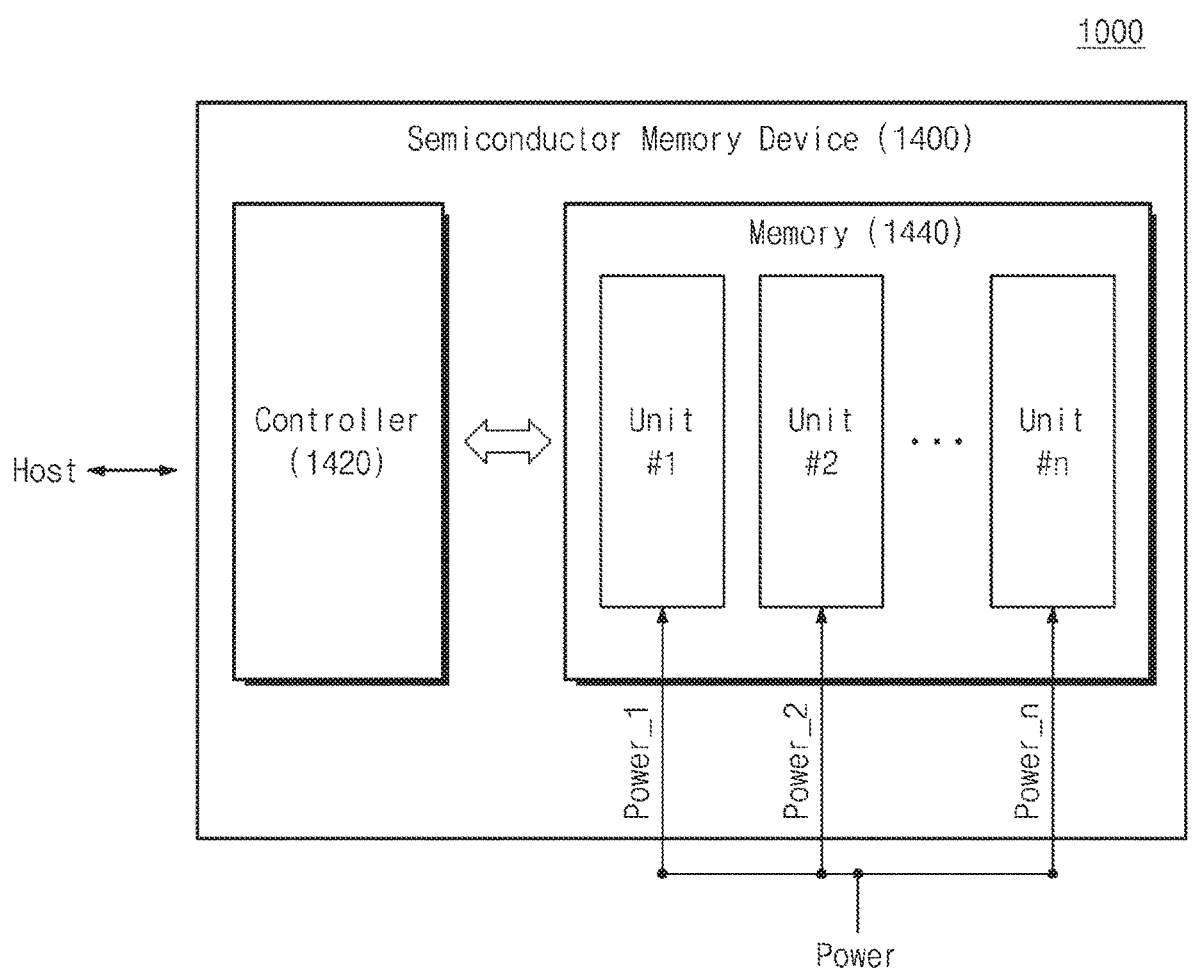
FIG. 1 is a block diagram of an electronic device according to an exemplary embodiment of the inventive concept.

Exemplary embodiments of the inventive concept provide a device and a method for efficiently supplying a power for an operation of a memory.

Below, exemplary embodiments of the inventive concept will be described in detail with reference to the accompanying drawings. Like reference numerals may refer to like elements throughout this application.

FIG. 1 is a block diagram of an electronic device according to an exemplary embodiment of the inventive concept.

An electronic device 1000 may provide information necessary to a user by executing an application or storing and managing data. According to an exemplary embodiment of the inventive concept, the electronic device 1000 may be a device included in an infotainment system for a vehicle. For example, the electronic device 1000 may be a navigation device or a media content player. For example, the electronic device 1000 may be a device for an advanced driver assistance system (ADAS). According to an exemplary embodiment of the inventive concept, the electronic device 1000 may be a server device. According to an exemplary embodiment of the inventive concept, the storage device 1000 may be a personal computer, or a mobile electronic device such as, but not limited to, a notebook computer, a mobile phone, a personal digital assistant (PDA), or a camera.

The electronic device 1000 may include a semiconductor memory device 1400. The semiconductor memory device 1400 may store data or may store a result of processing a task received from a host such as an application processor. The semiconductor memory device 1400 may be used to load an application to be executed in the host or may temporarily store data needed to drive an application.

The host may provide various services to the user as one or more electronic circuits/chips/devices operate. The host according to an exemplary embodiment of the inventive concept. may perform various operations for the purpose of processing a command received from the user of the host 1200 and may provide a result of the operation to the user. The host according to an exemplary embodiment of the inventive concept. may include an operating system, an application, etc. The host according to an exemplary embodiment of the inventive concept may include, but is not limited to, an operation processor (e.g., a central processing unit (CPU), a graphic processing unit (GPU), or an application processor (AP)) including a dedicated logic circuit (e.g., a field programmable gate array (FPGA) or application specific integrated circuits (ASICs)). For example, the host may be a processor that drives a camera in the electronic device 1000 or drives a game application installed in the electronic device 1000.

The semiconductor memory device 1400 may include a memory 1440 and a controller 1420 that controls the memory 1440.

The controller 1420 may control data input/output associated with the memory 1440. The controller 1420 and the memory 1440 may be connected through a bus channel. A control signal and a data signal may be transmitted between the controller 1420 and the memory 1440 through the bus channel. The controller 1420 may efficiently control the supply of the power for an operation of the memory 1440. This will be described in detail below.

The controller 1420 may include one or more hardware components (e.g., an analog circuit and a logic circuit) that are configured to perform various functions described above and to be described below. Additionally or alternatively, the controller 1420 may include one or more processor cores. Functions of the controller 1420 described above and to be described below may be implemented with a program code of software and/or firmware, and the processor core(s) of the controller 1420 may execute an instruction set of the program code. The processor core(s) of the controller 1420 may process various kinds of arithmetic operations and/or logical operations for the purpose of executing the instruction set.

The memory 1440 may include a volatile memory and/or a nonvolatile memory.

The memory 1440 may include a volatile memory such as a dynamic random-access memory (DRAM) or a static random-access memory (SRAM), or a nonvolatile memory such as an embedded multimedia card (eMMC), universal flash storage (UFS), or a solid state drive (SSD). For example, the memory 1440 may be any one selected from a group of double data rate 2 (DDR2) DRAM, DDR3 DRAM, mobile DRAM, extended data output (EDO), phase-change RAM (PRAM), OneDRAM, Pseudo SRAM, low power DDR (LpDDR-series) DRAM, ferroelectric RAM (FRAM), Graphic DRAM, and resistive RAM (ReRAM). As another example, the memory 1440 may be any one selected from a group of NAND flash, NOR flash, OneNAND, PRAM, and ReRAM. However, the inventive concept is not limited thereto. For example, the memory 1440 may include any type of memory device for storing data.

The memory 1440 may include one or more units Unit #1, Unit #2, . . . , Unit # n. A unit may refer to a physical component of the memory 1440, for example, any one of a package, a die, or a chip. According to an exemplary embodiment of the inventive concept, the memory 1440 may include one or more packages, each of which may include one or more dies. Additionally, a die may include one or more chips.

Figure 2:
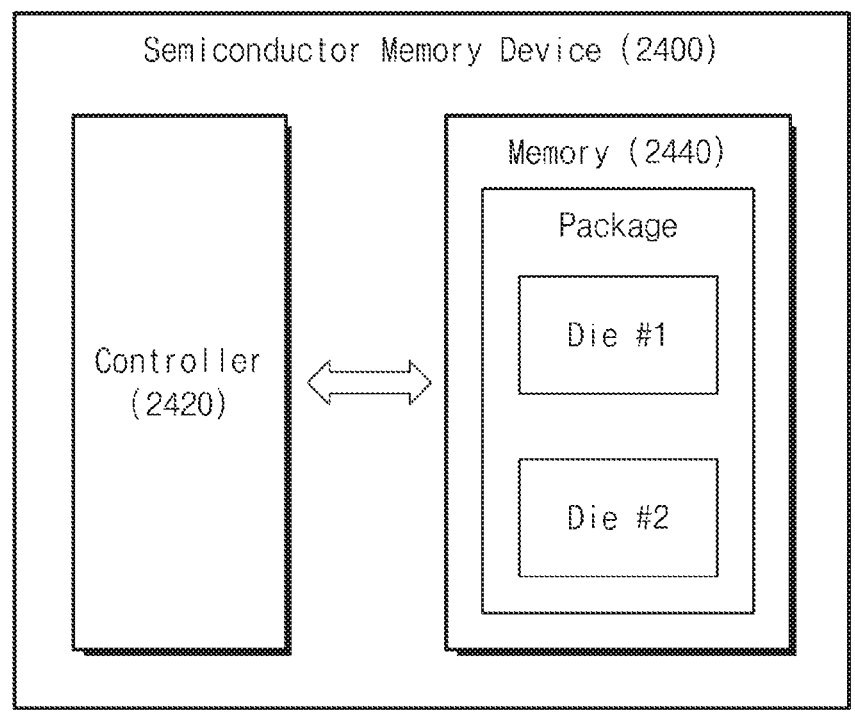
FIG. 2 is a block diagram of a semiconductor memory device according to an exemplary embodiment of the inventive concept.

FIG. 2 is a block diagram of a semiconductor memory device according to an exemplary embodiment of the inventive concept.

Referring to FIG. 2, a semiconductor memory device 2400 corresponds to the semiconductor memory device 1400 of FIG. 1 according to an exemplary embodiment of the inventive concept. The semiconductor memory device 2400 may include a memory 2440 and a controller 2420 that controls the memory 2440. The memory 2440 may be implemented with a single package including two dies Die #1 and Die #2.

A die may refer to a minimum fabrication unit of a memory. For example, a die may refer to an individual chip itself fabricated on a wafer through various semiconductor fabricating processes. The semiconductor manufacturing processes may include an oxidation process, a photolithography process, a thin film forming process, an etching process, and a CMP process. However, the inventive concept is not limited thereto, and a die may include more than one chip (e.g., two chips).

The one or more dies may be assembled in one package. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

When a data read request or a data write request is received from a host such as an application processor, the controller 2420 may transmit a read command or a write command to the memory 2440 through first and second channels. For example, the first channel is a dedicated channel of the die Die #1, and the second channel is a dedicated channel of the die Die #2.

The die Die #1 may receive a command, an address, and data through the first channel. Additionally, the die Die #1 may output data read from a memory cell through the first channel. The die Die #2 may receive a command, an address, and data through the second channel. Additionally, the die Die #2 may output data read from a memory cell through the second channel.

In the present exemplary embodiment of FIG. 2, units constituting the memory 2440 may be the dies Die #1 and Die #2.

Figure 3:
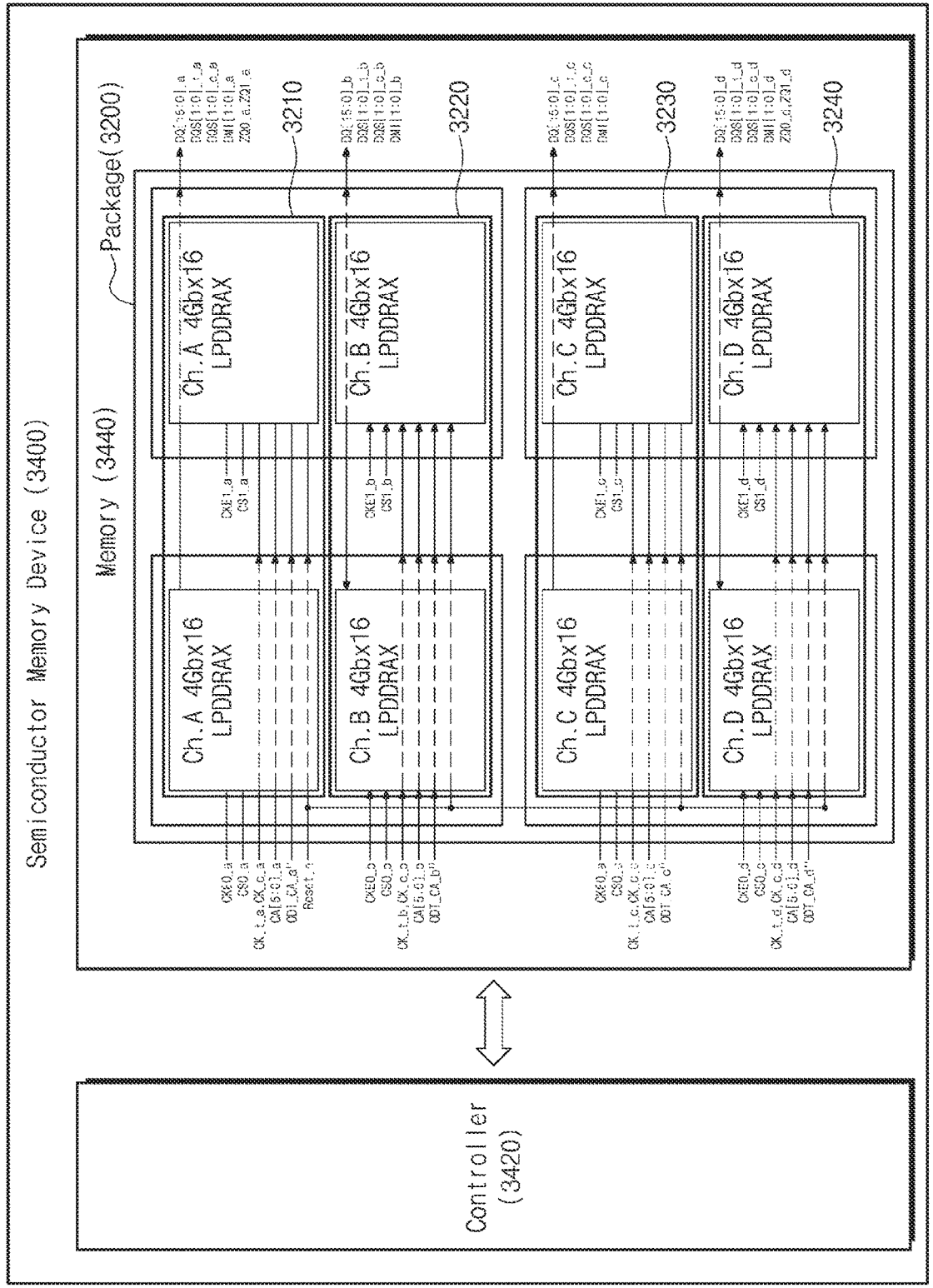
FIG. 3 is a block diagram illustrating a detailed configuration of a semiconductor memory device according to an exemplary embodiment of the inventive concept.

FIG. 3 is a block diagram illustrating a detailed configuration of a semiconductor memory device according to an exemplary embodiment of the inventive concept.

Referring to FIG. 3, a semiconductor memory device 3400 corresponds to the semiconductor memory device 1400 of FIG. 1. The semiconductor memory device 3400 may include a memory 3440 and a controller 3420 that controls the memory 3440. The memory 3440 according to an exemplary embodiment of the inventive concept may be a DRAM of the LPDDR4 series.

The memory 3440 may include a single package 3200. The package 3200 may include four dies 3210, 3220, 3230, and 3240.

Two chips may be included in each of the dies 3210, 3220, 3230, and 3240. For example, the die 3210 may include two chips Ch.A 4 Gb×16 LPDDRAX each having a 4-gigabit (Gb) capacity. Similarly, the die 3220 may include two chips Ch.B 4 Gb×16 LPDDRAX, the die 3230 may include two chips Ch.C 4 Gb×16 LPDDRAX, and the die 3240 may include two chips Ch.D 4 Gb×16 LPDDRAX. According to an exemplary embodiment of the inventive concept, chips included in one die may be distinguished by a chip select (CS) signal received from the controller 3420 and may share an address and data channel. For example, two chips Ch.A 4 Gb×16 LPDDRAX included in the die 3210 may be distinguished by using chip select signals CS0_a and CS1_a.

In the present exemplary embodiment of FIG. 3, units constituting the memory 3440 may be the four dies 3210, 3220, 3230, and 3240 and chips included in the respective four dies 3210, 3220, 3230, and 3240.

The configurations of the semiconductor memory device 2400/3400 described with reference to FIGS. 2 and 3 are merely exemplary, and the inventive concept is not limited thereto. For example, the semiconductor memory device 1400 may include the memory 1440 that is composed of a plurality of packages. In this case, the memory 1440 may be a hierarchical structure having the order of a package, a die, and a chip.

Referring back to FIG. 1, the power may be supplied for an operation of the semiconductor memory device 1400. The power output from a power device such as a battery of the electronic device 1000 may be supplied to the memory 1440. For example, a power supply voltage VDD and an input/output voltage VDDQ for determining a voltage level of a signal used for data input/output may be provided from the power.

The power may be blocked with regard to a part of all the units Unit #1, Unit #2, . . . , Unit # n of the memory 1440. For example, power Power_1 for an operation of the unit Unit #1 may be supplied to the unit Unit #1, but power Power_2 for an operation of the unit Unit #2 may not be supplied to the unit Unit #2 and power Power_n for an operation of the unit Unit # n may not be supplied to the unit Unit # n. To this end, the electronic device 1000 may allow the power to be supplied or blocked for each of the units Unit #1, Unit #2, . . . , Unit # n of the memory 1440. The electronic device 1000 may block the power supply to an unused unit of the memory 1440, thus minimizing unnecessary power consumption.

The controller 1420 may allow the power to be supplied or blocked independently with respect to each of the units Unit #1, Unit #2, . . . , Unit # n of the memory 1440. To this end, the controller 1420 may perform an interface with a power gating module.

The power gating module may refer to a hardware component or an electronic circuit such as an FPGA or an ASIC. As will be described later, the power gating circuit may include, but is not limited to, a plurality of power gating elements (e.g., switches) corresponding to the plurality of units Unit #1, Unit #2, . . . , Unit # n. Alternatively, the power gating circuit may include, but is not limited to, a register to record information about the power supply states of the plurality of units Unit #1, Unit #2, . . . , Unit # n.

Figure 4:
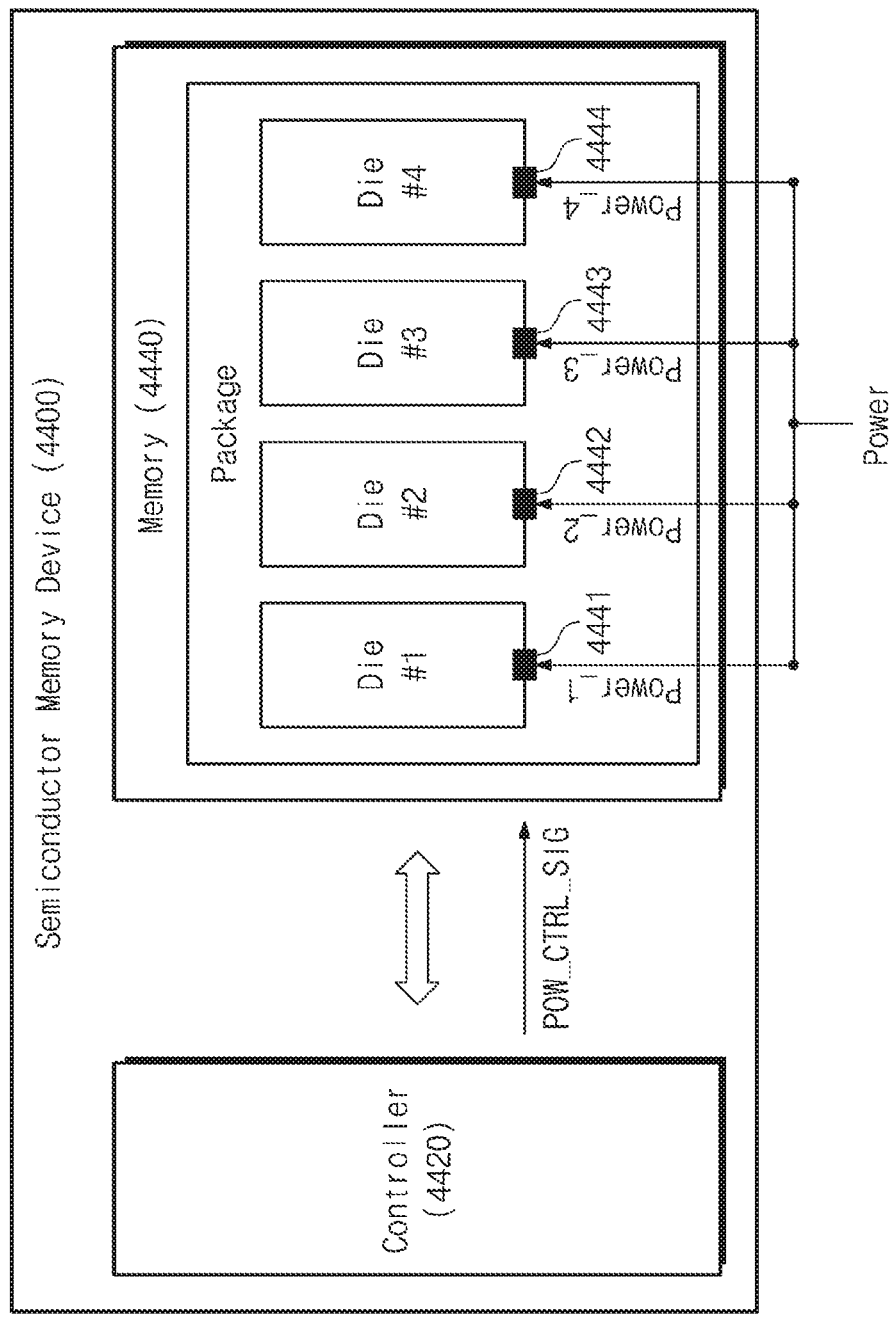
FIG. 4 is a block diagram of a semiconductor memory device according to an exemplary embodiment of the inventive concept.

FIG. 4 is a block diagram of a semiconductor memory device according to an exemplary embodiment of the inventive concept.

A semiconductor memory device 4400 of FIG. 4 corresponds to the semiconductor memory device 1400 of FIG. 1. Accordingly, the above description provided with regard to the semiconductor memory device 1400 of FIG. 1 may be applied to the semiconductor memory device 4400 of FIG. 4.

The semiconductor memory device 4400 may include a memory 4440 and a controller 4420 that controls the memory 4440. The memory 4440 according to an exemplary embodiment of the inventive concept may include a single package, and the single package may include a plurality of dies Die #1, Die #2, Die #3, and Die #4. As described with reference to FIG. 1, the power supply or block associated with the plurality of dies Die #1, Die #2, Die #3, and Die #4 may be independently determined for each die. For example, the power may be supplied to the dies Die #1 and Die #2 of the plurality of dies Die #1, Die #2, Die #3, and Die #4.

The semiconductor memory device 4400 may include a power gating module for supplying or blocking the power for each die. For example, the semiconductor memory device 4400 may include power gating elements 4441, 4442, 4443, and 4444 that correspond to the plurality of dies Die #1, Die #2, Die #3, and Die #4, respectively. For example, the semiconductor memory device 4400 may include the power gating element 4441 corresponding to the die Die #1, the power gating element 4442 corresponding to the die Die #2, the power gating element 4443 corresponding to the die Die #3, and the power gating element 4444 corresponding to the die Die #4.

The power gating elements 4441, 4442, 4443, and 4444 are illustrated in FIG. 4 as being adjacent to the corresponding dies, but the inventive concept is not limited thereto. The power gating elements 4441, 4442, 4443, and 4444 may be included within the controller 4420, or may be placed between the controller 4420 and the memory 4440. In the case where a power management integrated circuit (PMIC) scheme is used in the electronic device 1000, the power gating elements 4441, 4442, 4443, and 4444 may be placed within the PMIC. This will be described with reference to FIG. 5.

Each of the power gating elements 4441, 4442, 4443, and 4444 may be implemented with an on/off switch that may pass the power to the corresponding die or may block the power. For example, when the power gating element 4441 is turned off, the power Power_1 for an operation of the die Die #1 may be blocked. When the power gating element 4442 is turned off, the power Power_2 for an operation of the die Die

2 may be blocked. When the power gating element 4443 is turned off, the power Power_3 for an operation of the die Die #3 may be blocked. When the power gating element 4444 is turned off, the power Power_4 for an operation of the die Die #4 may be blocked.

According to an exemplary embodiment of the inventive concept, each of the power gating elements 4441, 4442, 4443, and 4444 may be implemented with a transistor for passing or blocking a current. For example, each of the power gating elements 4441, 4442, 4443, and 4444 may pass or block a current flowing to the corresponding die by using a transistor having a high threshold voltage.

The controller 4420 may control the power gating elements 4441, 4442, 4443, and 4444 through a control signal POW_CTRL_SIG. For example, the controller 4420 may change an on/off state of each of the power gating elements 4441, 4442, 4443, and 4444 through the control signal POW_CTRL_SIG.

According to an exemplary embodiment of the inventive concept, the memory 4440 may include a mode register for recording information about whether to block the power to be supplied to dies Die #1, Die #2, Die #3, and Die #4. For example, the on/off states of the power gating elements 4441, 4442, 4443, and 4444 may be recorded in the mode register. In this case, the controller 4420 may set or change information about whether to block the power, which is recorded in the mode register, through the control signal POW_CTRL_SIG.

Under control of the controller 4420, the power supply to at least a part of dies to which the power is being currently supplied may be blocked. Alternatively, under control of the controller 4420, the power may be newly supplied to one or more units of units to which the power is not supplied. In this case, the controller 4420 may perform initialization on the one or more units to which the power is newly supplied. This will be described with reference to FIG. 8.

In FIG. 4, an operation of the electronic device 1000 is described by using a die as an example, but the die of FIG. 4 may be replaced with any type of unit such as a package or a chip.

Figure 5:
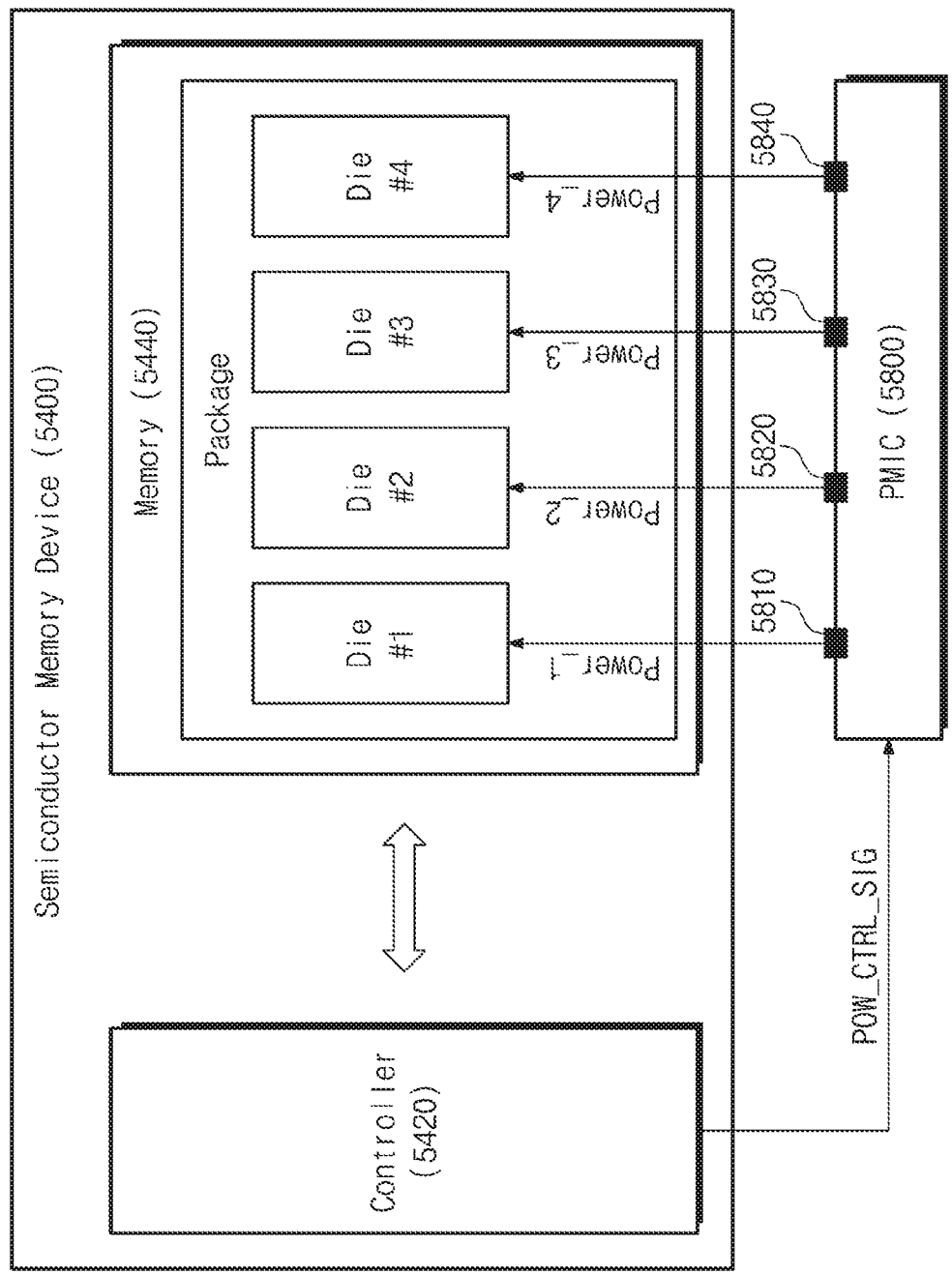
FIG. 5 is a block diagram of a semiconductor memory device according to an exemplary embodiment of the inventive concept.

FIG. 5 is a block diagram of a semiconductor memory device according to an exemplary embodiment of the inventive concept.

A semiconductor memory device 5400 of FIG. 5 corresponds to the semiconductor memory device 1400 of FIG. 1. Accordingly, the above description provided with regard to the semiconductor memory device 1400 of FIG. 1 may be applied to the semiconductor memory device 5400 of FIG. 5.

The semiconductor memory device 5400 may include a memory 5440 and a controller 5420 that controls the memory 5440. The memory 5440 according to an exemplary embodiment of the inventive concept may include a single package, and the single package may include the plurality of dies Die #1, Die #2, Die #3, and Die #4.

The semiconductor memory device 5400 may be electrically connected with a power management integrated circuit (PMIC) 5800. The PMIC 5800, which is a semiconductor device for controlling the power output from a power device and transmitting the output power to the semiconductor memory device 5400, may be included within the electronic device 1000.

The PMIC 5800 may include a power gating module for controlling an output of the power that is supplied for each of dies Die #1, Die #2, Die #3, and Die #4. In this case, the controller 5420 may control the power gating module of the PMIC 5800 through the control signal POW_CTRL_SIG.

For example, whether to output the power Power_1 for an operation of the die Die #1 from the PMIC 5800 may be determined depending on a state of the power gating element 5810. Whether to output the power Power_2 for an operation of the die Die #2 from the PMIC 5800 may be determined depending on a state of the power gating element 5820. Whether to output the power Power_3 for an operation of the die Die #3 from the PMIC 5800 may be determined depending on a state of the power gating element 5830. Whether to output the power Power_4 for an operation of the die Die #4 from the PMIC 5800 may be determined depending on a state of the power gating element 5840. In the case where the power gating element 5810 and the power gating element 5820 are turned off, the power Power_1 for an operation of the die Die #1 and the power Power_2 for an operation of the die Die #2 may be blocked.

Figure 6:
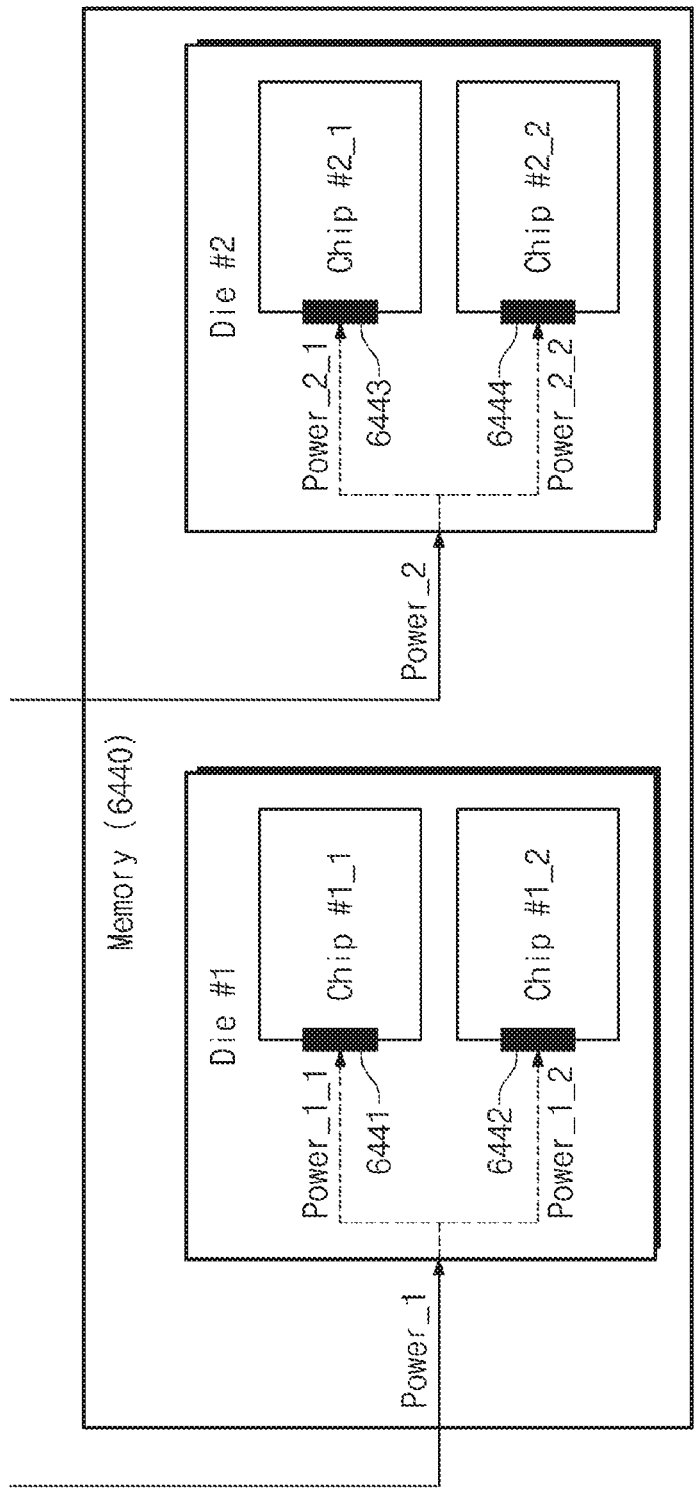
FIG. 6 is a block diagram of a memory according to an exemplary embodiment of the inventive concept.

FIG. 6 is a block diagram of a memory according to an exemplary embodiment of the inventive concept.

A memory 6440 of FIG. 6 corresponds to the semiconductor memory device 1440 of FIG. 1. The above description provided with regard to the memory 1440 of FIG. 1 may be applied to the memory 6440 of FIG. 6.

The memory 6440 may include two dies Die #1 and Die #2. As described above, the supply of the power Power_1 for an operation of the die Die #1 and the supply of the power Power_2 for an operation of the die Die #2 may be controlled independently of each other.

According to an exemplary embodiment of the inventive concept, in the electronic device 1000, the power may be independently supplied to each of a plurality of chips included in a die.

For example, in the case where the die Die #1, to which the power is supplied (or the power of which is not blocked), includes two chips Chip #1_1 and Chip #1_2, the supply of a power Power_1_1 for an operation of the chip Chip #1_1 and the supply of a power Power_1_2 for an operation of the chip Chip #1_2 may be controlled independently of each other. To this end, the memory 6440 may include, but is not limited to, a power gating element 6441 corresponding to the chip Chip #1_1 and a power gating element 6442 corresponding to the chip Chip #1_2.

Additionally, in the case where the die Die #2, to which the power is supplied (or the power of which is not blocked), includes two chips Chip #2_1 and Chip #2_2, the supply of a power Power_2_1 for an operation of the chip Chip #2_1 and the supply of a power Power_2_2 for an operation of the chip Chip #2_2 may be controlled independently of each other. To this end, the memory 6440 may include, but is not limited to, a power gating element 6443 corresponding to the chip Chip #2_1 and a power gating element 6444 corresponding to the chip Chip #2_2.

Figure 7:
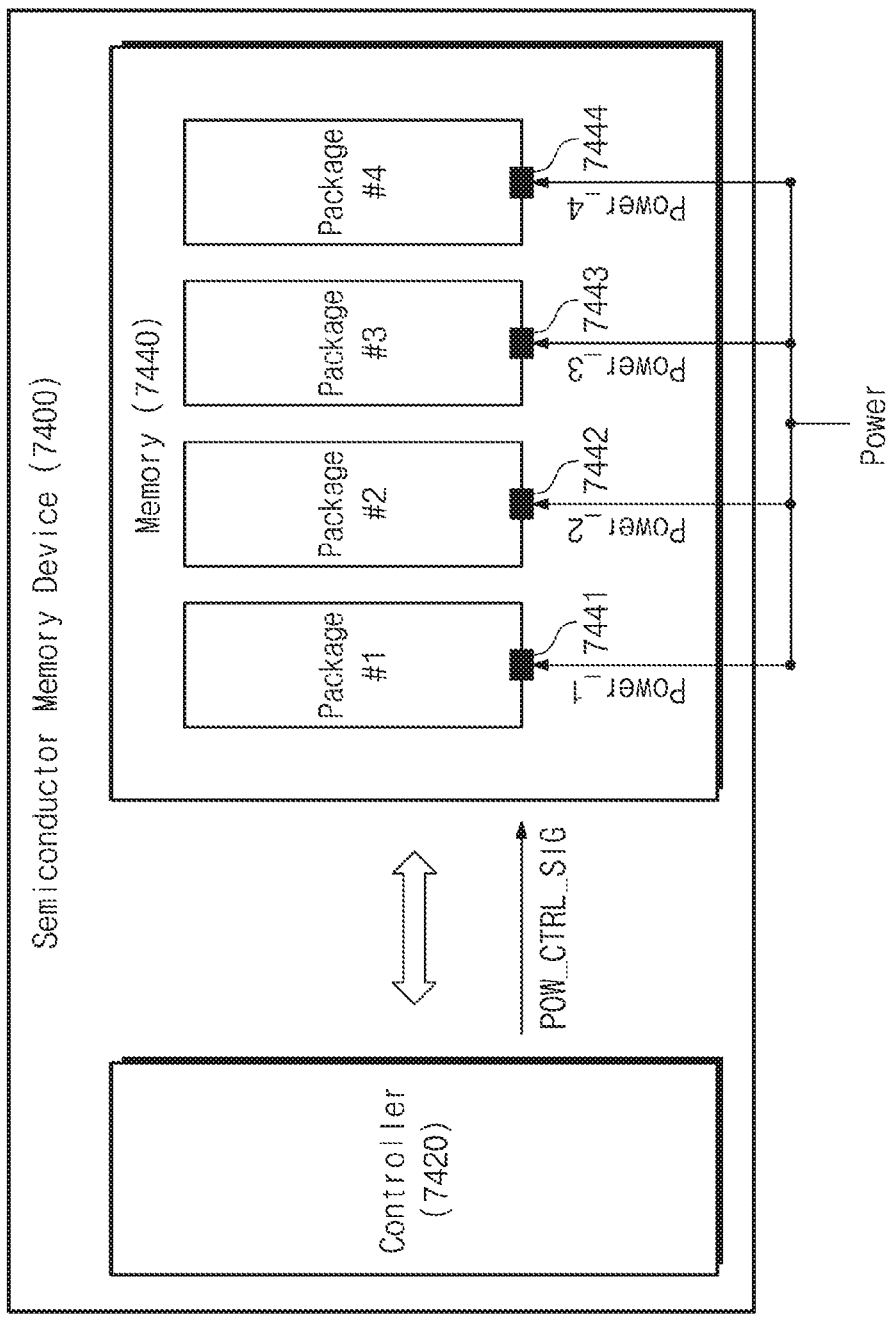
FIG. 7 is a block diagram of a semiconductor memory device according to an exemplary embodiment of the inventive concept.

FIG. 7 is a block diagram of a semiconductor memory device according to an exemplary embodiment of the inventive concept.

A semiconductor memory device 7400 of FIG. 7 corresponds to the semiconductor memory device 1400 of FIG. 1. Accordingly, the above description provided with regard to the semiconductor memory device 1400 of FIG. 1 may be applied to the semiconductor memory device 7400 of FIG. 7.

The semiconductor memory device 7400 may include a memory 7440 and a controller 7420 that controls the memory 7440. The memory 7440 according to an exemplary embodiment of the inventive concept may include a plurality of packages Package #1, Package #2, Package #3, and Package #4. As described with reference to FIG. 1, the supply or block of the power for an operation of the memory

7440 may be controlled for each of the packages Package #1, Package #2, Package #3, and Package #4. For example, the power may be supplied to the packages Package #1 and Package #2 of the plurality of packages Package #1, Package #2, Package #3, and Package #4.

The semiconductor memory device 7400 may include a power gating module for supplying or blocking the power for each of the package Package #1, Package #2, Package #3, and Package #4. According to an exemplary embodiment of the inventive concept, the semiconductor memory device 7400 may include power gating elements 7441, 7442, 7443, and 7444 that correspond to the plurality of packages Package #1, Package #2, Package #3, and Package #4, respectively.

Each of the power gating elements 7441, 7442, 7443, and 7444 may be implemented with an on/off switch that may pass the power to the corresponding package or may block the power. The controller 7420 may control on/off states of the power gating elements 7441, 7442, 7443, and 7444 through the control signal POW_CTRL_SIG.

The power gating module (e.g., the power gating elements 7441, 7442, 7443, and 7444) is illustrated in FIG. 7 as being placed within the semiconductor memory device 7400. However, the power gating module may be placed on the outside of the semiconductor memory device 7400 (e.g., may be placed in the PMIC 5800 of FIG. 5). In this case, the controller 7420 may control the power gating module by transmitting a control signal through a separate pin of the semiconductor memory device 7400. However, the inventive concept is not limited thereto.

According to an exemplary embodiment of the inventive concept, in a package to which the power is supplied, whether to supply the power for operating dies in the package may be determined for each die. To this end, the controller 7420 may perform the operation described with reference to FIG. 4. Additionally, in a die to which the power is supplied, whether to supply the power for operating chips in the die may be determined for each chip. To this end, the controller 7420 may perform the operation described with reference to FIG. 6. In other words, in the case where the memory 7440 is composed of a plurality of packages, a power control operation may be hierarchically performed in the order of a package, a die, and a chip.

Figure 8:
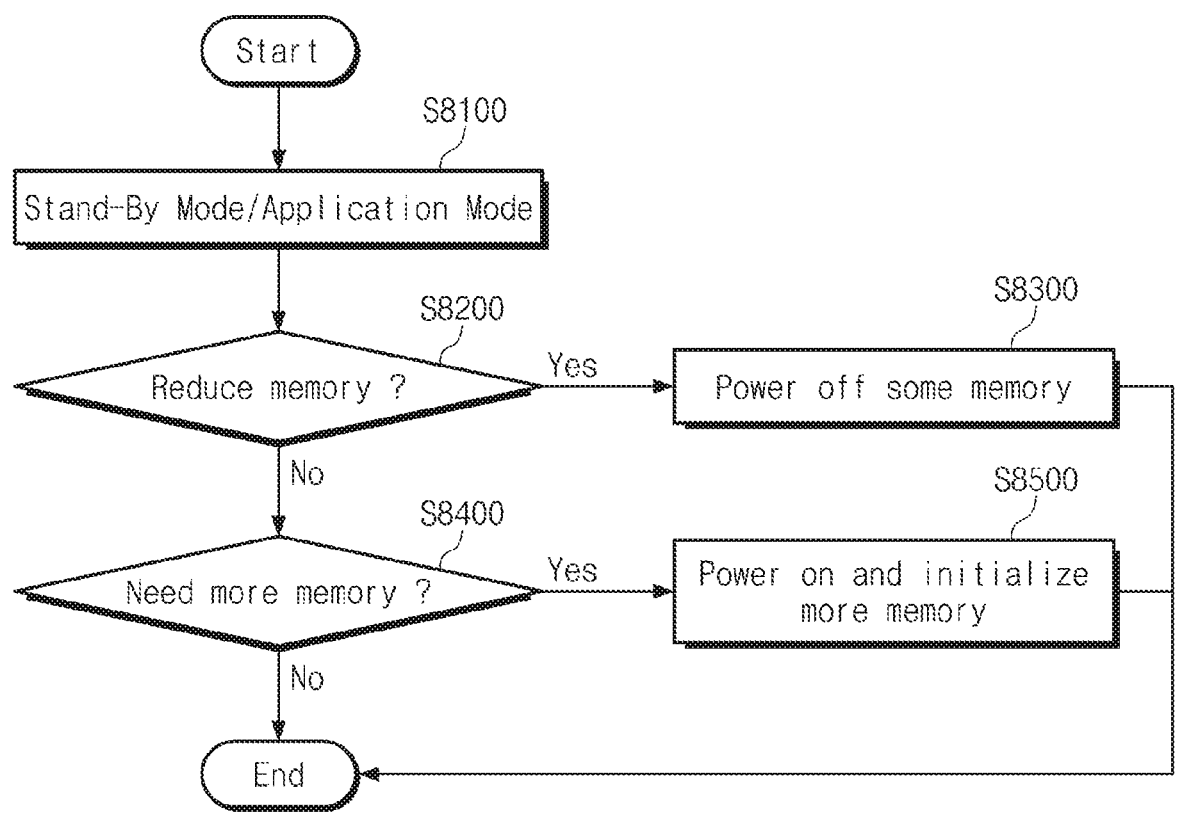
FIG. 8 is a flowchart of a method of controlling power supply to a memory in an electronic device according to an exemplary embodiment of the inventive concept.

FIG. 8 is a flowchart of a method of controlling the power supply to a memory in an electronic device according to an exemplary embodiment of the inventive concept.

In operation S8100, the electronic device 1000 may enter a stand-by mode or an application mode. The stand-by mode may refer to a state in which a user does not use any function of the electronic device 1000. Alternatively, the stand-by mode may refer to a state in which only a background process is performed or in which only an initial screen is displayed in a display of the electronic device 1000. The application mode may refer to a state in which a certain function or a certain application of the electronic device 1000 is being driven. For example, the electronic device 1000 may enter the application mode as the user allows the electronic device 1000 to drive a camera thereof or allows the electronic device 1000 to execute a game application thereof.

In operation S8200, the electronic device 1000 may determine whether it is possible to reduce the capacity of a memory to which the power is supplied. For example, the electronic device 1000 may compare a memory capacity, which an application being currently executed needs, with the capacity of the memory, to which the power is being supplied. For example, in the case where the capacity of the memory to which the power is being currently supplied exceeds the capacity of the memory needed to execute an application by a reference value or more, the electronic device 1000 may determine that it is possible to reduce the capacity of the memory to which the power is supplied. When it is possible to reduce the capacity of the memory to which the power is supplied, in operation S8300, the power supply to a partial region of the memory may be blocked. Otherwise, in operation S8400, the electronic device 1000 may determine whether to supply the power to more regions of the memory.

In operation S8300, the electronic device 1000 may block the power that is supplied to a part of the entire region of the memory, to which the power is currently supplied. According to an exemplary embodiment of the inventive concept, a controller of the electronic device 1000 may block the power supply to a part of all the units constituting the memory by performing an interface operation with the power gating module. For example, a unit may be, but is not limited to, any one of a package, a die, and a chip.

In operation S8400, the electronic device 1000 may determine whether more memory capacity is needed for an operation being currently executed (e.g., for execution of an application). For example, the electronic device 1000 may compare a memory capacity necessary for the execution of an application with the capacity of the memory, to which the power is being supplied. In the case where more memory capacity is needed than the capacity of the memory, to which the power is being supplied, in operation S8500, the electronic device 1000 may additionally supply the power to a memory region, to which the power is not supplied. Otherwise, the power control operation of the electronic device 1000 may be terminated.

In operation S8500, the electronic device 1000 may additionally supply the power to the memory region, to which the power is not currently supplied. For example, the electronic device 1000 may additionally supply the power to at least a part of units, to which the power is not supplied, of the memory. A unit to which the power is additionally supplied may be, but is not limited to, any one of a package, a die, and a chip.

The electronic device 1000 may perform initialization on the memory unit to which the power is additionally supplied. According to an exemplary embodiment of the inventive concept, the initialization may include a training operation, which is an operation of adjusting a data input or output timing so as to be matched with a bus. The training operation may be performed to increase the reliability of data input to or output from the memory. The electronic device 1000 may use data (e.g., a data pattern) recorded in a register of the electronic device 1000 as training data for the training operation. As such, the initialization may be quickly performed on the unit to which the power is additionally supplied. Furthermore, the initialization may include an operation of setting a mode register with respect to the unit to which the power is additionally supplied. As such, when the power is additionally supplied, the initiation of the mode register of the corresponding to unit may be automatically performed.

Figure 9:
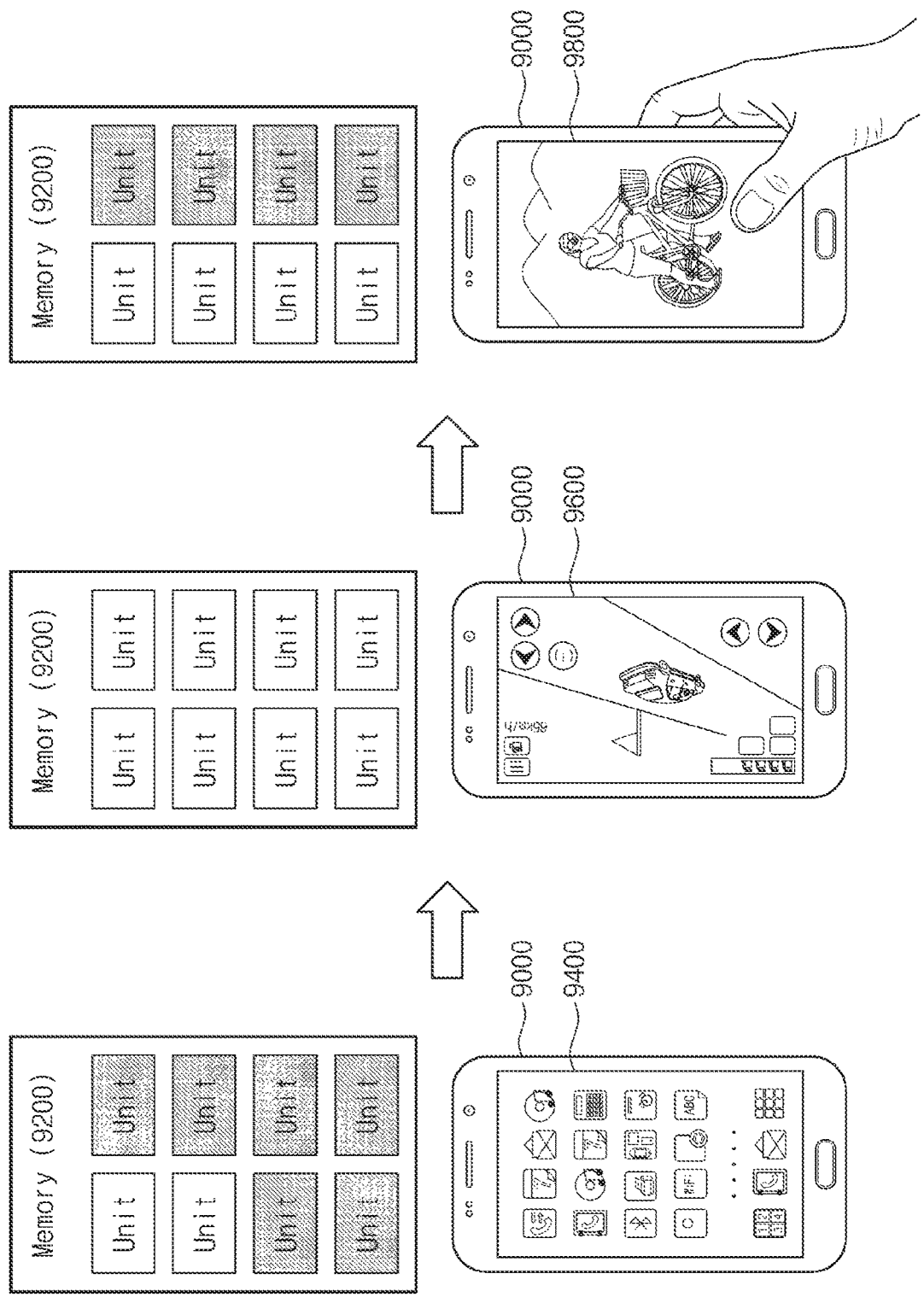
FIG. 9 is a conceptual diagram indicating how a capacity of a memory supplied with a power varies in a smartphone according to an exemplary embodiment of the inventive concept.

FIG. 9 is a conceptual diagram indicating an operation in which a capacity of a memory supplied with a power varies in a smartphone according to an exemplary embodiment of the inventive concept.

A smartphone 9000 may be the electronic device 1000 described with reference to FIG. 1. A memory 9200 may be placed within the smartphone 9000, and may be used to load an application to be executed in the smartphone 9000 or to temporarily store data needed to execute an application. According to an exemplary embodiment of the inventive concept, the memory 9200 may include 8 units. Each unit may be, but is not limited to, any one of a package, a die, and a chip. A unit, the power supply of which is blocked, may be marked by a shaded box, and a unit to which the power is supplied may be marked by an unshaded box.

In the case where the smartphone 9000 is in a stand-by mode 9400, the number of units, to which the power is supplied, from among units of the memory 9200, is two. In other words, the smartphone 9000 may prevent unnecessary power consumption by blocking the power supply to the remaining unused units. The stand-by mode 9400 may refer to a state in which any function of the smartphone 9000 is not performed or a state in which a relatively simple task, such as a task of sending a text message or a task of making up a text, is performed.

In the case where a game application 9600 is executed in the smartphone 9000, the power may be supplied to all units of the memory 9200. When an application, which needs a high-capacity memory, such as the game application 9600, is executed, the smartphone 9000 may increase the number of units of the memory 9200 to which the power will be supplied, and may perform initialization on the units of the memory 9200 to which the power is additionally supplied.

In the case where the execution of the game application 9600 is stopped and a camera application 9800 is executed in the smartphone 9000, the number of units of the memory 9200, to which the power is supplied, may decrease to 4. In other words, the smartphone 9000 may prevent unnecessary power consumption by blocking the power supply to four unused units.

Figure 10:
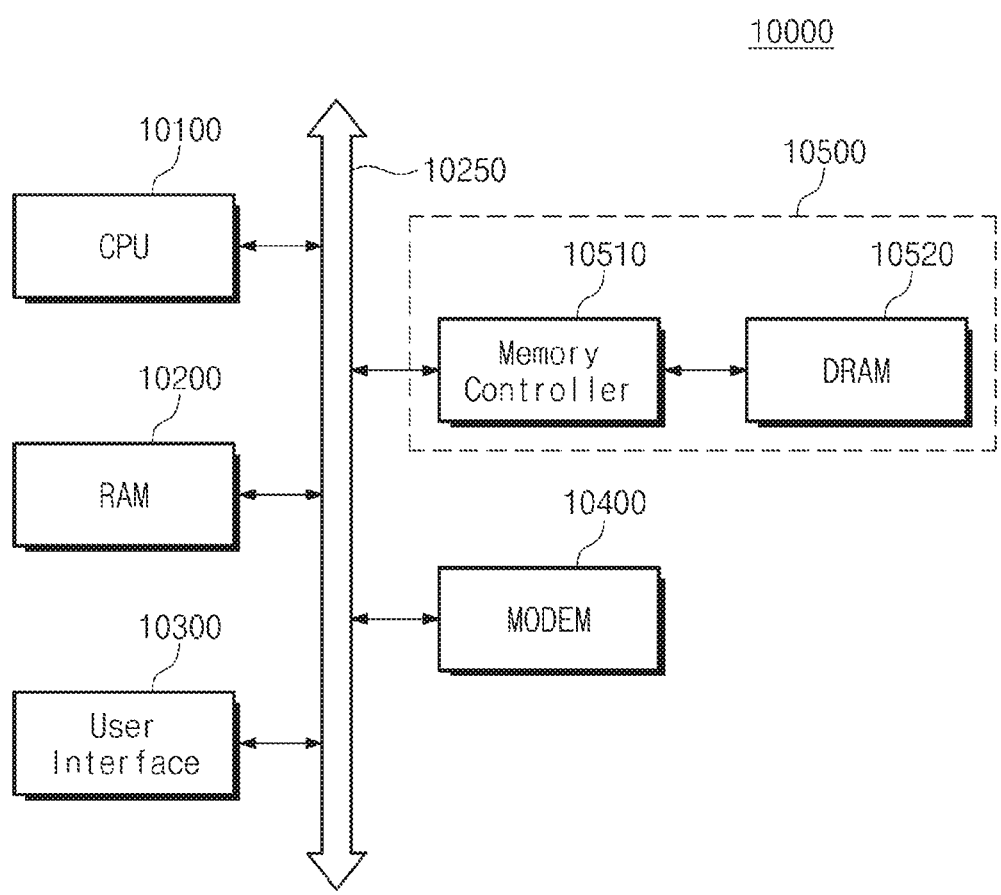
FIG. 10 is a block diagram of a computing device according to an exemplary embodiment of the inventive concept.

FIG. 10 is a block diagram of a computing device according to an exemplary embodiment of the inventive concept.

Referring to FIG. 10, a computing device 10000 may include a memory system 10500 including a DRAM 10520 and a memory controller 10510. The computing device 10000 may include an information processing device, a computer, etc. For example, the computing device 10000 may include a modulator/demodulator (MODEM) 10400, a central processing unit (CPU) 10100, a RAM 10200, and a user interface 10300 which are electrically connected to a system bus 10250, in addition to the memory system 10500. Data processed by the CPU 10100 or data input from external sources may be stored in the memory system 10500.

The memory system 10500 may be implemented with the semiconductor memory device 1400 of FIG. 1. The supply of power for an operation of the DRAM 10520 may be controlled for each of a plurality of units constituting the DRAM 10520. Accordingly, unnecessary power consumption may be prevented as the power supply to unused units is blocked. The number of units, to which the power will be supplied, from among the units of the DRAM 10520 may be determined depending on a state of the CPU 10100. For example, in the case where a task that needs a high-capacity memory is performed in the CPU 10100, the number of units, to which the power will be supplied, from among the units of the DRAM 10520, may increase; otherwise, the number of units, to which the power will be supplied, from among the units of the DRAM 10520, may decrease. The memory controller 10510 may apply a command, an address, data, and any other control signal to the DRAM 10520 for each channel.

The CPU 10100 may function as a host and may control overall operations of the computing device 10000. For example, the CPU 10100 may correspond to the host of FIG. 1.

A host interface between the CPU 10100 and the memory controller 10510 may include various protocols for performing data exchange between the host and the memory controller 10510. For example, the memory controller 10510 may be configured to communicate with the host or the outside through at least one of a variety of interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, or an integrated drive electronics (IDE) protocol.

The computing device 10000 may be provided as one of various components of an electronic device: a computer, a ultra-mobile personal computer (UMPC), a digital picture player, a digital video recorder, a digital video player, storage constituting a data center, a device that may transmit and receive information in a wireless environment, one of various electronic devices constituting a home network, one of various electronic devices constituting a computer network, one of various electronic devices constituting a telematics network, a radio-frequency identification (RFID) device, or one of various components constituting a computing system.

Figure 11:
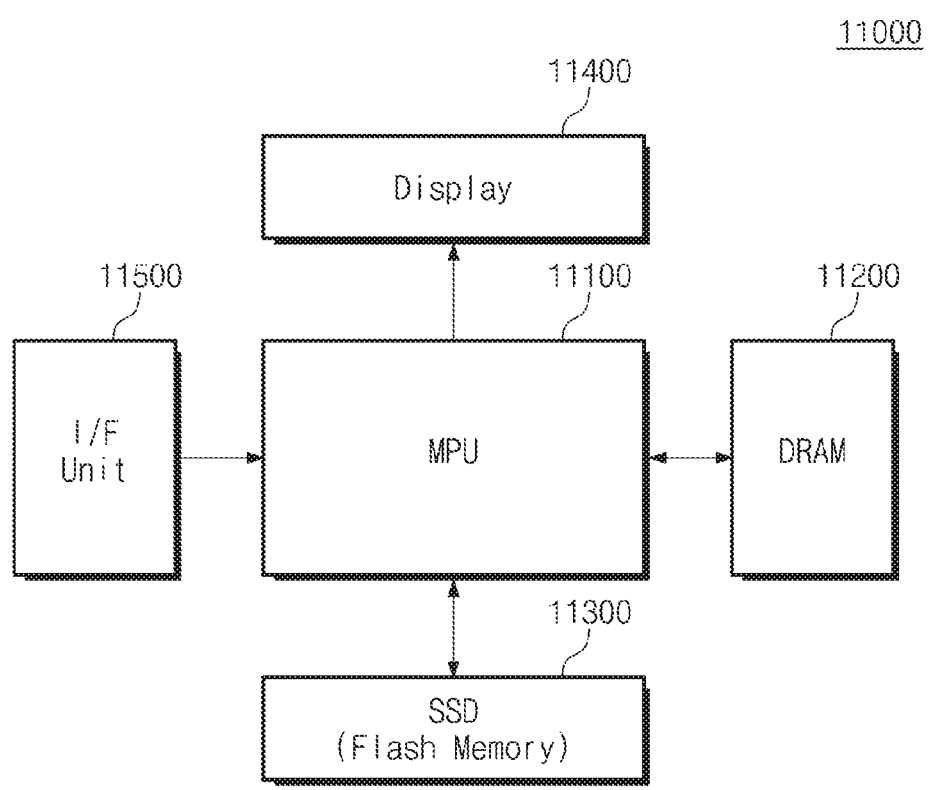
FIG. 11 is a block diagram of a mobile device according to an exemplary embodiment of the inventive concept.

FIG. 11 is a block diagram of a mobile device according to an exemplary embodiment of the inventive concept.

Referring to FIG. 11, a mobile device 11000 may include a micro processing unit (MPU) 11100, a display 11400, an interface unit 11500, a DRAM 11200, and a solid state drive (SSD) 11300.

In the case where the mobile device 11000 is a portable communication device, a MODEM and a transceiver that perform a function of modulating and demodulating data and a function of transmitting and receiving communication data may be connected to the interface unit 11500.

The MPU 11100 may control overall operations of the mobile device 11000 depending on a preset program.

The DRAM 11200 may be connected with the MPU 11100 through a system bus and may function as a buffer memory or a main memory of the MPU 11100. The supply of power for an operation of the DRAM 11200 may be controlled for each of a plurality of units constituting the DRAM 11200. Accordingly, unnecessary power consumption may be prevented as the power supply to unused units of the DRAM 11200 is blocked. The number of units, to which the power will be supplied, from among the units of the DRAM 11200, may be determined depending on a state of the MPU 11100. For example, in the case where a task that needs a high-capacity memory is performed in the MPU 11100, the number of units, to which the power will be supplied, from among the units of the DRAM 11200, may increase; otherwise, the number of units, to which the power will be supplied, from among the units of the DRAM 11200, may decrease.

The solid state drive 11300 may include a flash memory. The flash memory may be a NOR-type or NAND-type flash memory. An example is illustrated in FIG. 11 where the solid state drive 11300 is a flash memory, but various kinds of nonvolatile storage may be used. The nonvolatile storage may store data information having various data forms such as a text form, a graphic form, or a software code form. For example, the nonvolatile storage may include an electrically erasable programmable read-only memory (EEPROM), a magnetic RAM (MRAM), a spin-transfer torque MRAM (STT-MRAM), a conductive bridging RAM (CBRAM), a ferroelectric RAM (FeRAM), a phase change RAM (PRAM) called "ovonic unified memory (OUM)", a resistive RAM (RRAM or ReRAM), a nanotube RRAM, a polymer RAM (PoRAM), a nano floating gate memory (NFGM), a holographic memory, a molecular electronics memory device, or an insulator resistance change memory.

The display 11400 may include an element such as liquid crystal display having a backlight or a light emitting diode (LED) light source or an organic LED, and have a touch screen. The display 11400 may function as an output device that displays an image, such as a character, a number, or a picture, in color.

The mobile device 11000 may further include an application chipset, a camera image processor (CIS), a mobile DRAM, etc.

Figure 12:
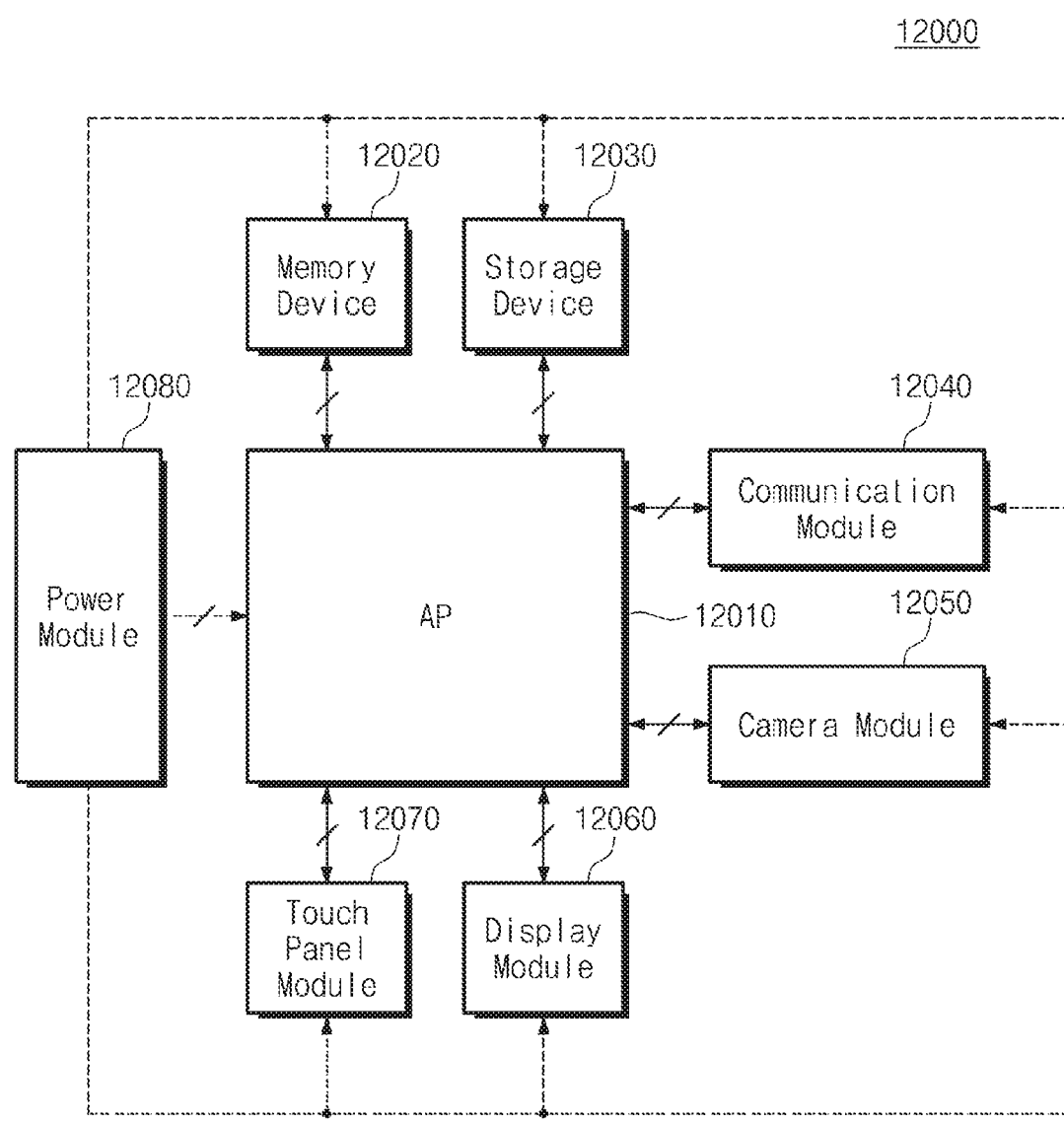
FIG. 12 is a block diagram of a portable multimedia device according to an exemplary embodiment of the inventive concept.

FIG. 12 is a block diagram of a portable multimedia device according to an exemplary embodiment of the inventive concept.

Referring to FIG. 12, a portable multimedia device 12000 may include an application processor (AP) 12010, a memory device 12020, a storage device 12030, a communication module 12040, a camera module 12050, a display module 12060, a touch panel module 12070, and a power module 12080.

The AP 12010 may perform a data processing function.

The communication module 12040 connected to the AP 12010 may function as a MODEM that performs functions of transmitting and receiving communication data and modulating and demodulating data.

The storage device 12030 may be implemented with a NOR-type or NAND-type flash memory for the purpose of storing a large amount of information.

The display module 12060 may be implemented with a liquid crystal display having a backlight or a light emitting diode (LED) light source or with an element such as an organic LED (OLED). The display module 12060 may function as an output device that displays an image, such as a character, a number, or a picture, in color.

The touch panel module 12070 may provide the AP 12010 with a touch input by itself or on the display module 12060.

The camera module 12050 may include a camera image processor (CIS) and may be connected with the AP 12010.

The power module 12080 may supply the power to each component of the portable multimedia device 12000 and may perform power management. The power module 12080 according to an exemplary embodiment of the inventive concept. may include a PMIC for power saving of the portable multimedia device 12000.

The supply of power for an operation of the memory device 12020 may be controlled for each of a plurality of units constituting the memory device 12020. In other words, the power output from the power module 12080 may be supplied to a part of all the units constituting the memory device 12020. Accordingly, unnecessary power consumption may be prevented as the power supply to unused units of the memory device 12020 is blocked depending on an application to be executed by the AP 12010. Additionally, depending on an application to be executed by the AP 12010, the power may be newly supplied to a unit(s) to be additionally used, and initialization may be performed on the unit(s) to be additionally used.

The portable multimedia device 12000 may further include any other application chipset, a mobile DRAM, etc.

The above-described method may be implemented by a code stored in a computer-readable recording medium. The computer-readable recording medium may include all kinds of storage devices in which data readable by a computer system are stored. Examples of the computer-readable recording medium include a read-only memory (ROM), a random access memory (RAM), a CD-ROM, a magnetic tape, a floppy disk, or an optical data storage device, and may also be implemented in the form of data transmission over the Internet. Additionally, in the computer-readable recording medium, a code, which a computer may read out, may be stored and executed in a computing system connected over a network in a distributed manner.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A semiconductor memory device comprising:
a memory including a plurality of units; and
a controller,
wherein, under control of the controller, a power for an operation of the memory is independently supplied to each of the plurality of units or is independently blocked with respect to each of the plurality of units,
wherein the power is additionally supplied to at least a part of the plurality of units to which the power is not supplied, under control of the controller, and
wherein the controller performs initialization on the at least a part of the plurality of units.

2. The semiconductor memory device of claim 1, wherein the memory is a dynamic random access memory (DRAM), and
wherein each of the plurality of units is one of a DRAM package, a DRAM die, or a DRAM chip.

3. The semiconductor memory device of claim 1, further comprising:
a power gating circuit configured to pass or block the power to each of the plurality of units,
wherein the controller performs an interface operation for controlling the power gating circuit.

4. The semiconductor memory device of claim 1, further comprising:
a plurality of power gating elements corresponding to the plurality of units, respectively,
wherein the plurality of power gating elements include on/off switches for passing or blocking the power to the plurality of units.

5. The semiconductor memory device of claim 1, further comprising:
a plurality of power gating elements corresponding to the plurality of units, respectively,
wherein the plurality of power gating elements include transistors for controlling a current flowing to the plurality of units.

6. The semiconductor memory device of claim 4, wherein the controller controls an on/off state of each of the plurality of power gating elements.

7. The semiconductor memory device of claim 1, wherein the memory further includes:
a register configured to record information about whether to block the power with respect to each of the plurality of units, and
wherein the controller manages the information of the register.

8. The semiconductor memory device of claim 1, wherein a supply of the power to at least a part of the plurality of units, to which the power is supplied, is blocked under control of the controller.

9. The semiconductor memory device of claim 1, wherein the initialization includes a training operation on the at least a part of the plurality of units, and
wherein the training operation is performed using a data pattern recorded in a register of the controller.

10. An electronic device comprising:
a semiconductor memory device;
a power management integrated circuit (PMIC) including a plurality of transistors connected to the semiconductor memory device via a plurality of power lines and configured to provide power to the semiconductor memory device through the plurality of power lines,
wherein the semiconductor memory device includes:
a memory including a package including a plurality of dies, wherein the plurality of dies are respectively connected to the plurality of transistors via the plurality of power lines; and
a controller, and
wherein the controller generates a control signal to independently control the plurality of transistors of the PMIC, and
wherein each of the plurality of transistors passes or blocks a current flowing to a corresponding one of the plurality of dies,
wherein power is additionally supplied to at least apart of the plurality of dies to which the current is not blocked, under control of the controller, and
wherein the controller performs initialization on the at least part of the plurality of dies.

11. An electronic device comprising:
a host; and
a semiconductor memory device,
wherein the semiconductor memory device includes:
a memory including a plurality of units; and
a controller,
wherein, under control of the controller, a power for an operation of the memory is independently supplied to each of the plurality of units or is independently blocked with respect to each of the plurality of units,
wherein the host is an application processor,
wherein the semiconductor memory device is configured to load an application to be executed in the host or to temporarily store data needed to drive the application, and
wherein, when a capacity of an area in the memory used to drive the application is smaller than a capacity of an area in the memory to which the power is supplied, a supply of the power to at least an unused part of the plurality of units of the area in the memory to which the power is supplied is blocked under control of the controller.

12. The electronic device of claim 11, wherein the memory is a dynamic random access memory (DRAM), and
wherein each of the plurality of units is one of a DRAM package, a DRAM die, or a DRAM chip.

13. The electronic device of claim 11, further comprising:
a power gating circuit configured to pass or block the power to each of the plurality of units,
wherein the controller performs an interface operation for controlling the power gating circuit.

14. The electronic device of claim 13, wherein the power gating module circuit includes:
a plurality of power gating elements corresponding to the plurality of units, respectively, and
wherein each of the plurality of power gating elements includes an on/off switch for passing or blocking the power.

15. The electronic device of claim 13, further comprising:
a power management integrated circuit (PMIC) configured to control a power output from a power device so as to be transmitted to the memory,
wherein the power gating circuit is included in the PMIC.

16. The electronic device of claim 11, wherein, when a capacity of the area in the memory to which the power is supplied is smaller than a capacity of the area in the memory used to drive the application, the power is additionally supplied to at least a part of the plurality of units, to which the power is not supplied, under control of the controller.

17. The electronic device of claim 16, wherein the controller performs initialization on the at least a part of the plurality of units to which the power is additionally supplied, and
wherein the initialization includes a training operation that is performed using a data pattern recorded in a register of the controller.

* * * * *